US007034361B1

(12) United States Patent
Yu et al.

(10) Patent No.: US 7,034,361 B1
(45) Date of Patent: Apr. 25, 2006

(54) NARROW BODY RAISED SOURCE/DRAIN METAL GATE MOSFET

(75) Inventors: Bin Yu, Cupertino, CA (US); Shibly S. Ahmed, San Jose, CA (US); Haihong Wang, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 153 days.

(21) Appl. No.: 10/653,234

(22) Filed: Sep. 3, 2003

(51) Int. Cl.
*H01L 27/01* (2006.01)
(52) U.S. Cl. ...................................... 257/349; 257/398
(58) Field of Classification Search ................... 257/65, 257/255, 347, 349; 438/183, 296
See application file for complete search history.

(56) References Cited

U.S. PATENT DOCUMENTS

| 6,395,589 | B1* | 5/2002 | Yu .............................. 438/183 |
| 6,455,383 | B1* | 9/2002 | Wu ............................. 438/296 |
| 6,835,988 | B1* | 12/2004 | Yamashita .................. 257/398 |
| 6,864,520 | B1* | 3/2005 | Fischetti et al. ............ 257/255 |
| 6,927,130 | B1* | 8/2005 | Suzuki ........................ 438/259 |
| 2004/0227187 | A1* | 11/2004 | Cheng et al. ............... 257/347 |

OTHER PUBLICATIONS

Digh Hisamoto et al.: "FinFET—A Self-Aligned Double-Gate MOSFET Scalable to 20 nm," IEEE Transactions on Electron Devices, vol. 47, No. 12, Dec. 2000, pp. 2320-2325.
Yang-Kyu Choi et al.: "Sub-20nm CMOS Fin FET Technologies," 2001 IEEE, IEDM, pp. 421-424.
Xuejue Huang et al.: "Sub-50 nm P-Channel Fin FET," IEEE Transactions on Electron Devices, vol. 48, No. .5, May 2001, pp. 880-886.
Yang-Kyu Choi et al.: "Nanoscale CMOS Spacer FinFET for the Terabit Era," IEEE Electron Device Letters, vol. 23, No. 1, Jan. 2002, pp. 25-27.
Xuejue Huang et al.: "Sub 50-nm FinFET: PMOS," 1999 IEEE, IEDM, pp. 67-70.
Co-pending U.S. Appl. No. 10/632,965, filed Aug. 4, 2003, entitled: "Semiconductor Device Having A Thin Fin And Raised Source/Drain Areas," Haihong Wang et al.; 18 page specification and 19 sheets of drawings.

* cited by examiner

*Primary Examiner*—David Nelms
*Assistant Examiner*—Dao H. Nguyen
(74) *Attorney, Agent, or Firm*—Harrity Snyder LLP (57) ABSTRACT

A semiconductor device includes a fin, a source region formed adjacent the fin and having a height greater than that of the fin, and a drain region formed adjacent the a second side of the fin and having a height greater than that of the fin. A metal gate region is formed at a top surface and at least one side surface of the fin. A width of the source and drain region may be greater than that of the fin. The semiconductor device may exhibit a reduced series resistance and an improved transistor drive current.

10 Claims, 12 Drawing Sheets

Fig. 11C

US 7,034,361 B1

NARROW BODY RAISED SOURCE/DRAIN METAL GATE MOSFET

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise in part because the double-gate MOSFET has a gate electrode on both sides of the channel, rather than on only one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the present invention provide a double-gate MOSFET that includes a metal gate, a narrow body and raised source/drain area.

One aspect of the invention is directed to a semiconductor device comprising an insulator and a semiconductor layer formed on the insulator, the semiconductor layer including a fin portion corresponding to a channel of the semiconductor device. A source region is formed at a first end of the semiconductor layer. A height of the source region is higher than that of the fin. A drain region is formed at a second end of the semiconductor layer and has a higher than that of the fin. A metal gate region is formed to overlap at a top surface and at least one side surface of the fin.

Another aspect of the invention is directed to a method for forming a semiconductor device. The method includes forming a semiconductor layer on an insulator, forming a dummy gate structure over at least a portion of the semiconductor layer and a portion of the insulator; and etching the semiconductor device to remove the dummy gate structure and to create an area previously occupied by the dummy gate structure. The method also includes etching the semiconductor device to decrease a width and height of the semiconductor layer in an area corresponding to a fin structure of the semiconductor device, and depositing a metal layer in the area previously occupied by the dummy gate structure, the metal layer forming a gate for the semiconductor device.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET, as the term is used herein, refers to a type of MOSFET in which a conducting channel is formed in a vertical Si "fin."

Implementations consistent with the present invention provide FinFET devices and methods of manufacturing such devices. The gates in the FinFET devices formed in accordance with the present invention may include a metal. The source/drain regions may be raised relative to the channel of the FinFET. This device structure exhibits reduced series resistance and thus improved transistor drive current.

Figure 1A:
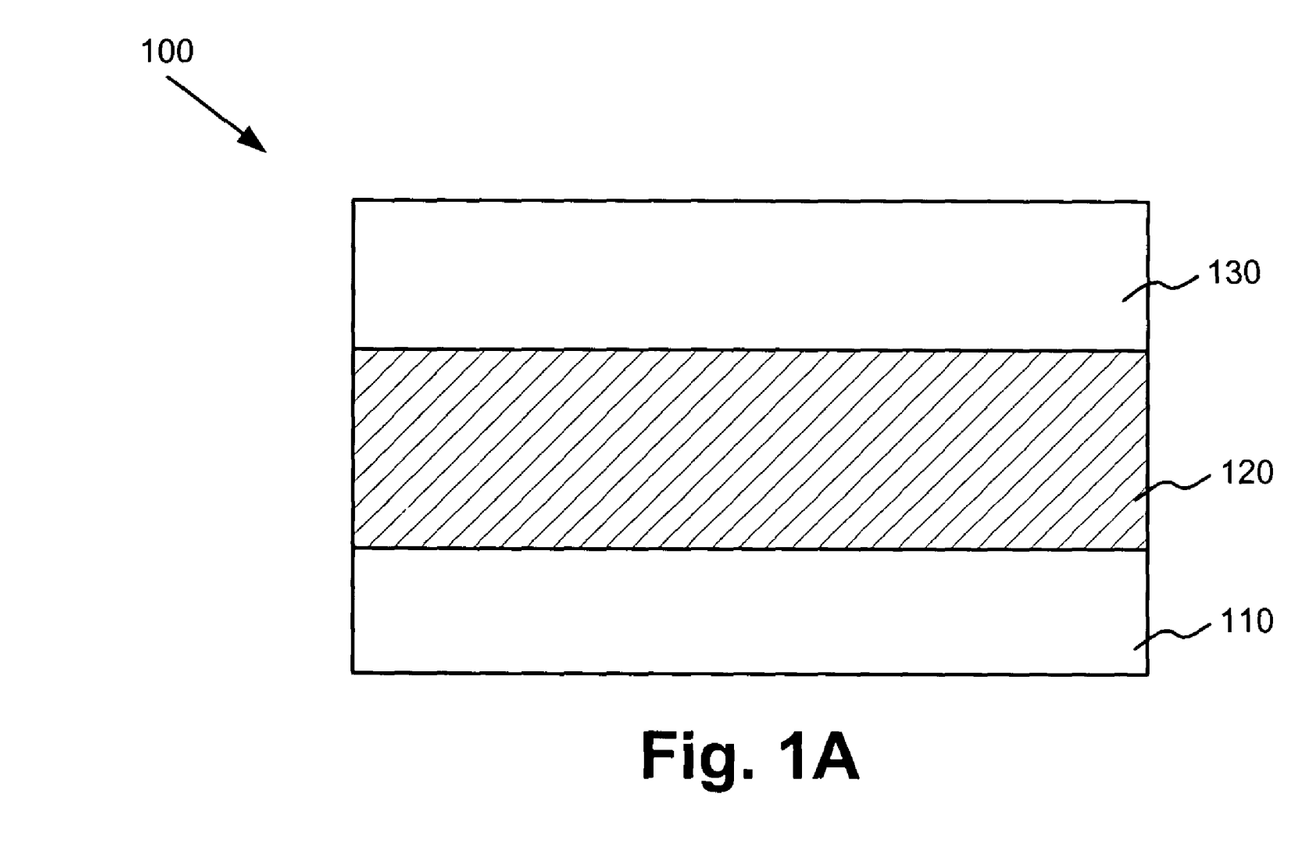
FIG. 1A is a cross-section of exemplary layers used to form a semiconductor device formed in accordance with an embodiment of the invention.

FIG. 1A illustrates a cross-section of a semiconductor device 100 formed in accordance with an embodiment of the present invention. Referring to FIG. 1A, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 600 Å to about 1000 Å. Silicon layer 130 is used to form a fin, a source, and a drain structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

Figure 1B:
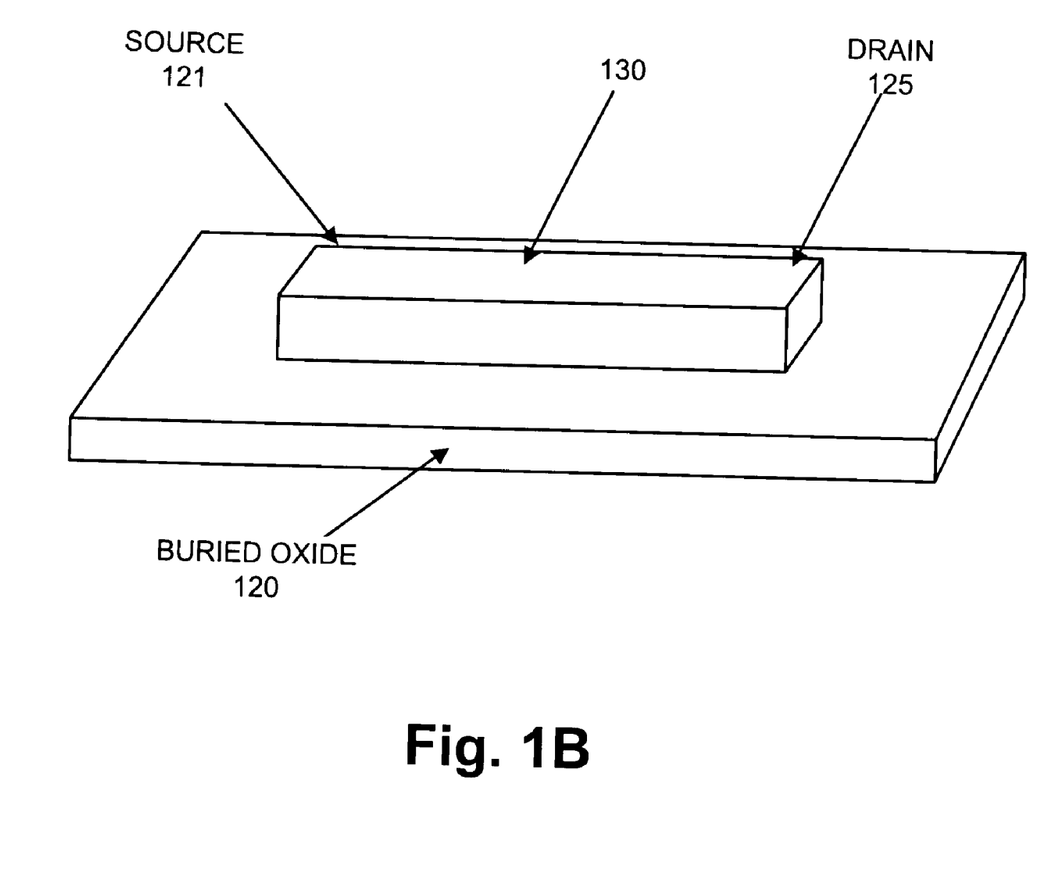
FIG. 1B is a perspective view of the semiconductor device shown in FIG. 1A.

Silicon layer 130 may be etched to form a rectangular active area. FIG. 1B is a perspective view illustrating semiconductor device 100, including the etched silicon layer 130. In an exemplary implementation, silicon layer 130 may be etched in a conventional manner, with the etching terminating on buried oxide layer 120 to form the rectangular silicon layer 130. As will be described in more detail below, area 121 of silicon layer 130 will eventually become the source region of the semiconductor device and area 125 will eventually become the drain region.

Figure 2A:
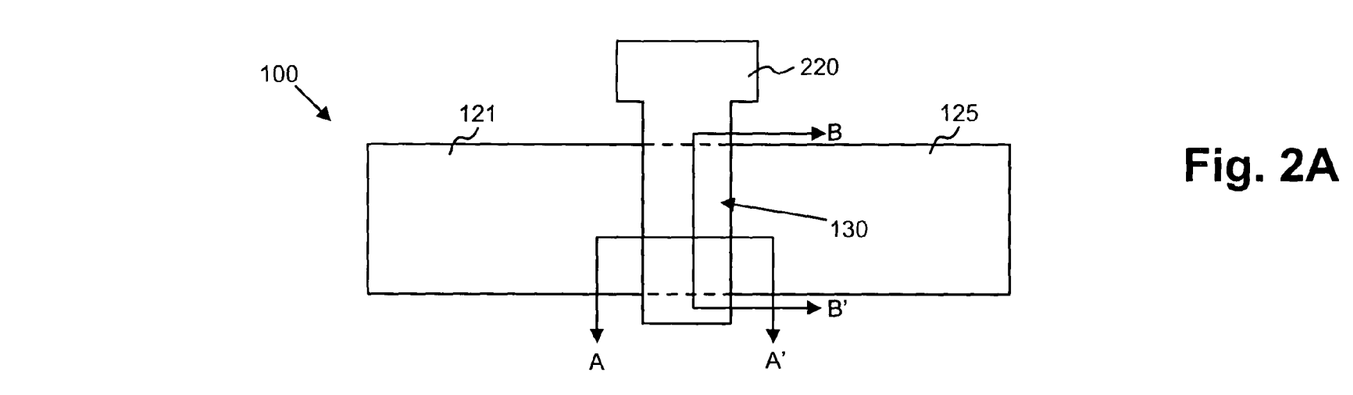
FIG. 2A is a top-view illustrating an additional stage in the formation of the semiconductor device.
Figure 2B:
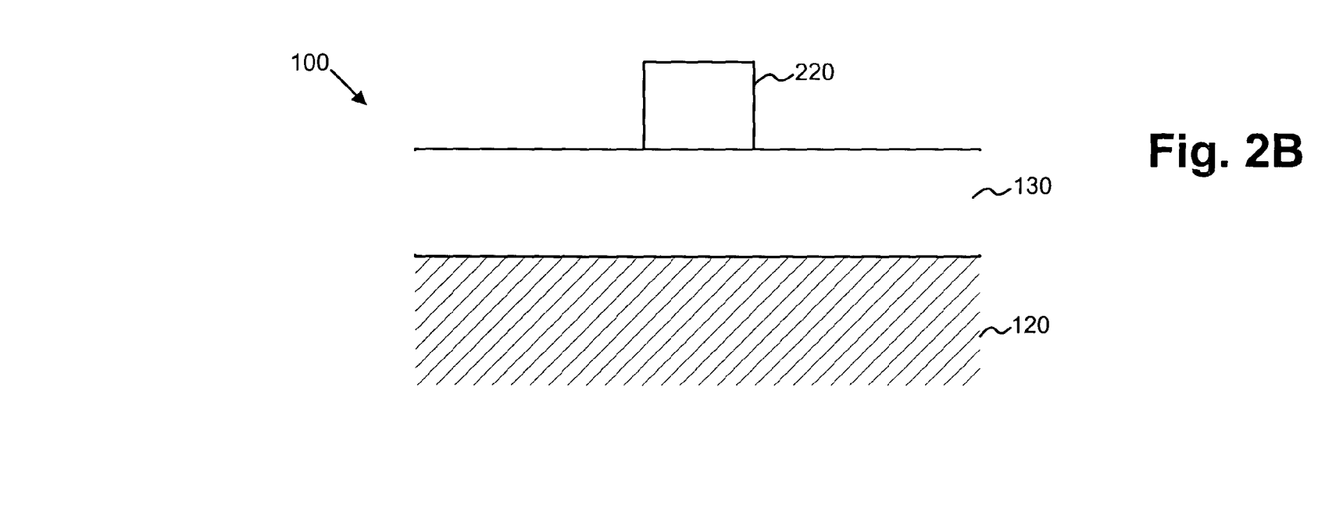
FIG. 2B is a cross-section taken along the line A—A' in FIG. 2A.

A dummy gate structure may next be deposited, patterned, and etched on semiconductor device 100. FIG. 2A is top view illustrating a dummy gate structure 220 that extends over a middle area of silicon layer 130. This middle area will eventually be the channel of the semiconductor device. Dummy gate structure 220 may be formed from a polysilicon layer that may be deposited using conventional chemical vapor deposition (CVD) or other well known techniques. The polysilicon layer may be etched in a conventional manner to form the resultant structure 220 shown in FIG. 2A. FIG. 2B is a cross-section taken along the line A–A' in FIG. 2A.

Figure 3:
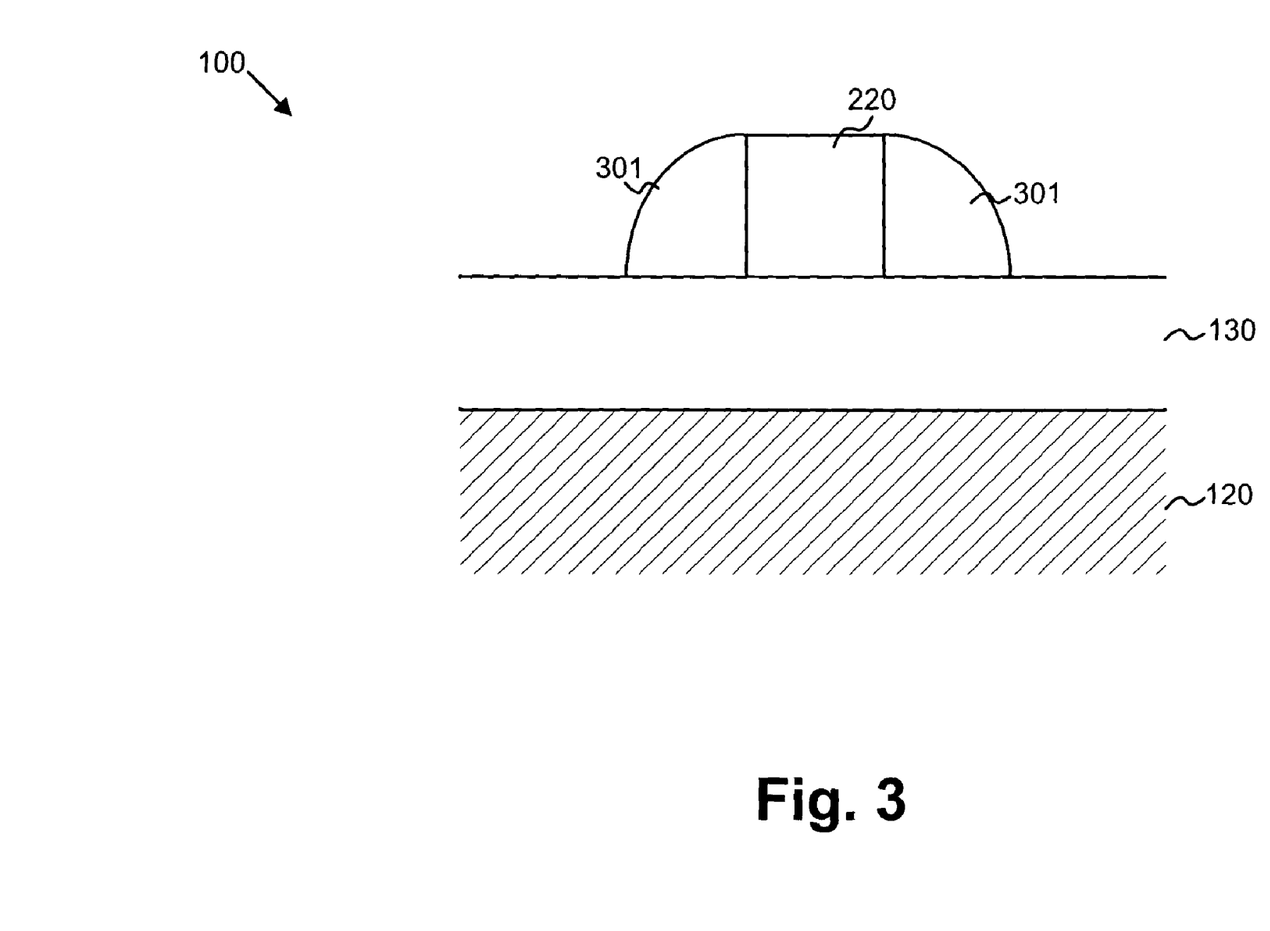
FIG. 3 is a cross-section illustrating a further stage in the formation of the semiconductor device shown in FIG. 2B.
Figure 4:
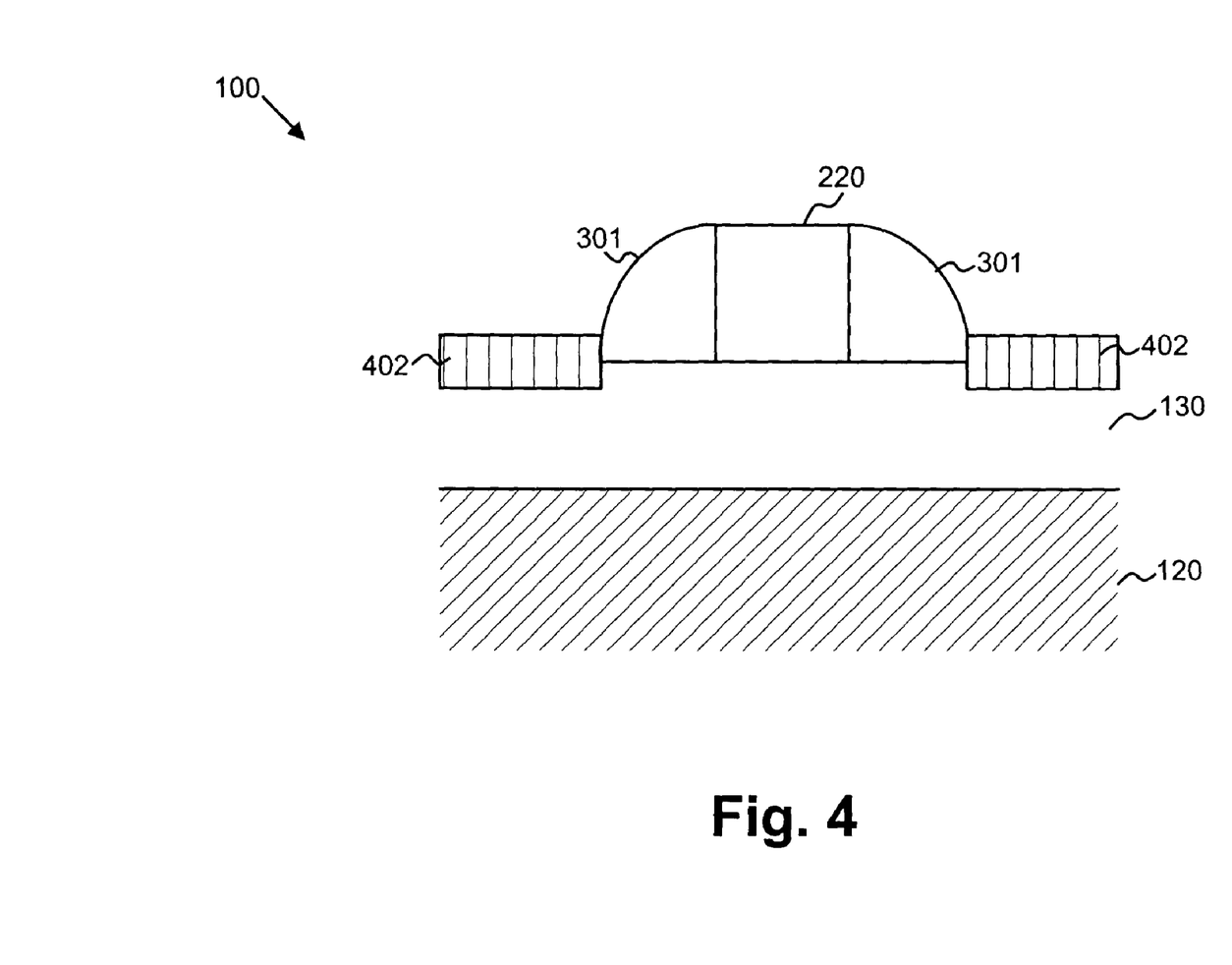
FIG. 4 is a cross-section illustrating a silicide material formed in a further stage in the formation of the semiconductor device shown in FIG. 3.

FIG. 3 is a cross-section taken along the line A–A' in FIG. 2A illustrating a further stage in the formation of semiconductor device 100. A spacer material may be deposited adjacent dummy gate structure 220 and etched to form sidewall spacers 301. Sidewall spacers 301 may include, for example, an oxide material, and may range from about 150 Å to about 1000 Å. A metal layer may next be deposited on semiconductor device 100. The metal layer may be, for example, tungsten, cobalt, titanium, tantalum, or molybdenum. The metal layer may then be thermally annealed to create a metal silicide compound in the exposed silicon areas of silicon layer 130. FIG. 4 illustrates the resultant silicide material 402 after silicidation. Silicide material 402 may extend over the source region 121 and the drain region 125.

Figure 5:
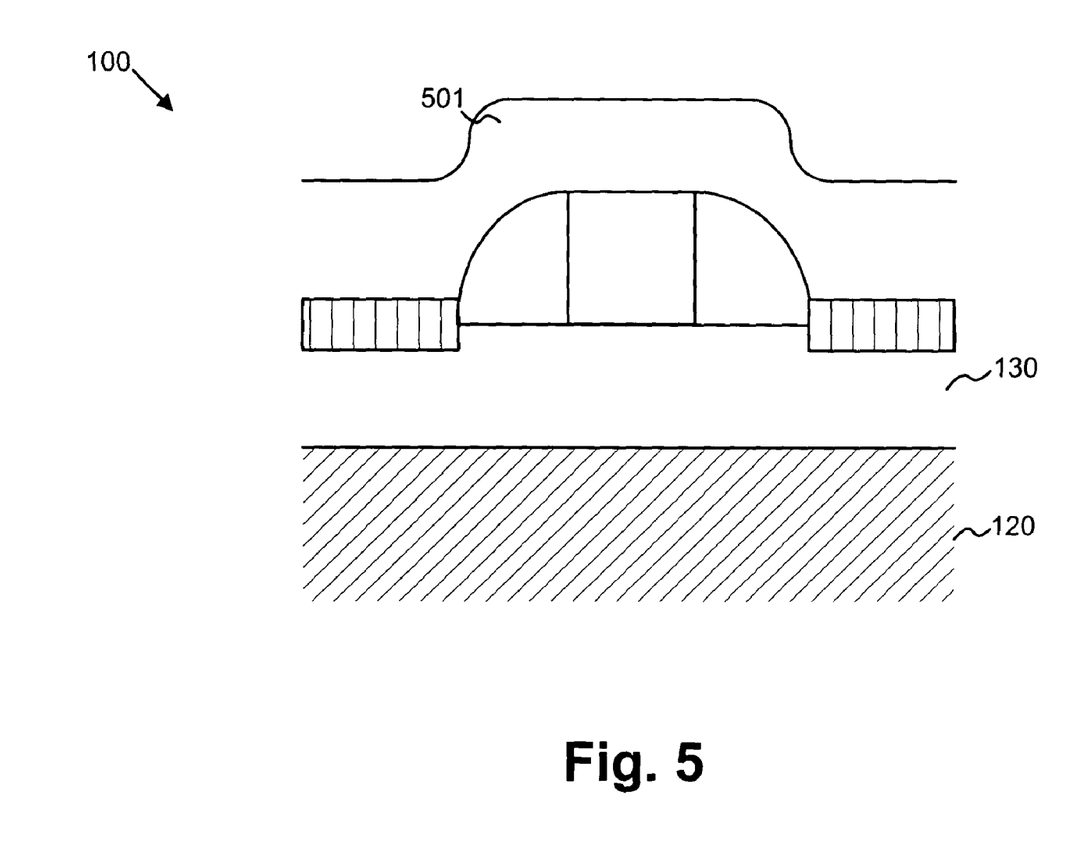
FIG. 5 is a cross-section illustrating a further stage in the formation of the semiconductor device shown in FIG. 4.

FIG. 5 is a cross-section illustrating a further stage in the formation of semiconductor device 100. As illustrated, a surrounding protective layer 501 may be deposited over semiconductor device 100. In one implementation consistent with the principles of the invention, surrounding layer 501 may include a dielectric material such as tetraethyl orthosilicate (TEOS), although other dielectric materials may be used. Surrounding layer 501 may be deposited to a thickness of about 1500 Å to about 3000 Å.

Figure 6:
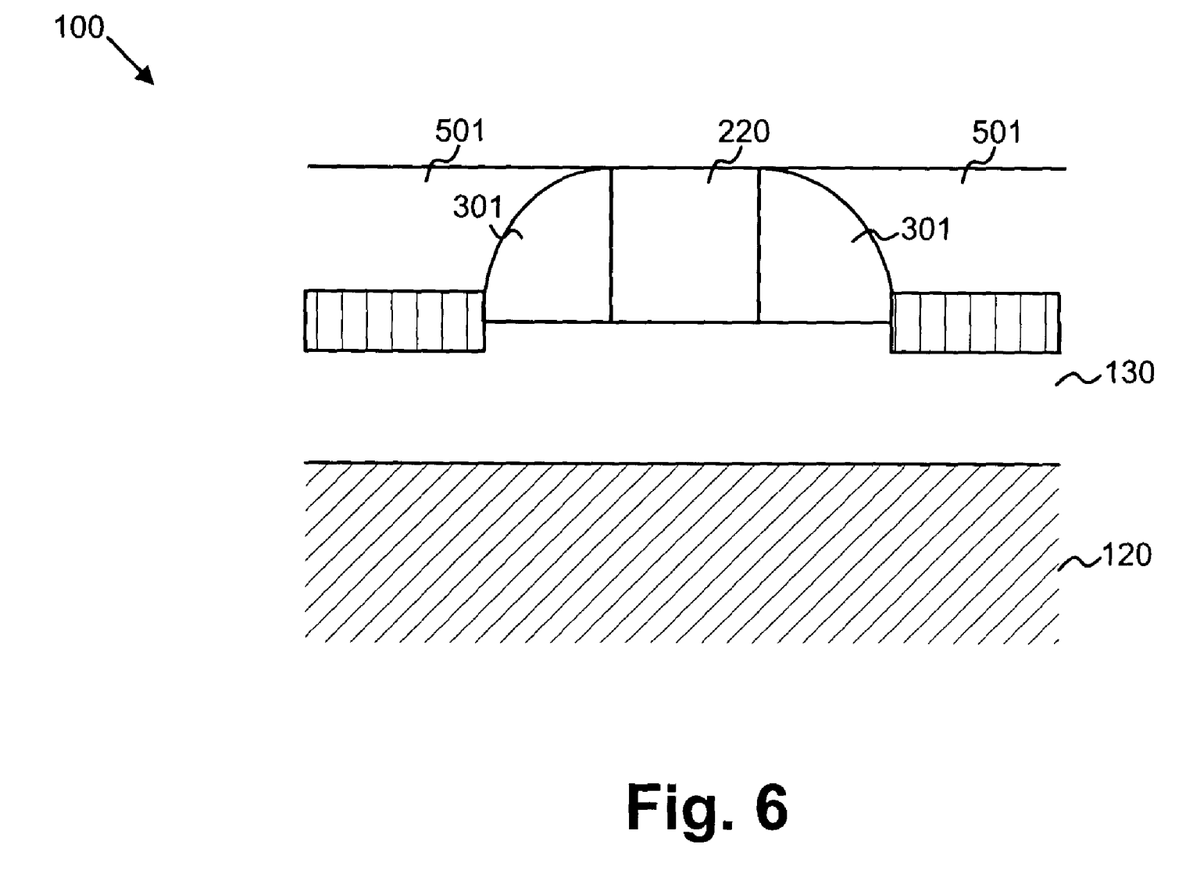
FIG. 6 is a cross-section illustrating planarization of the semiconductor device shown in FIG. 5.

As shown in FIG. 6, surrounding layer 501 may be planarized through a process such as chemical mechanical polishing (CMP). CMP is a know planarization technique that may be used to planarize a semiconductor surface. In one implementation, the planarization is performed until the upper surface of dummy gate structure 220 is exposed.

Figure 7:
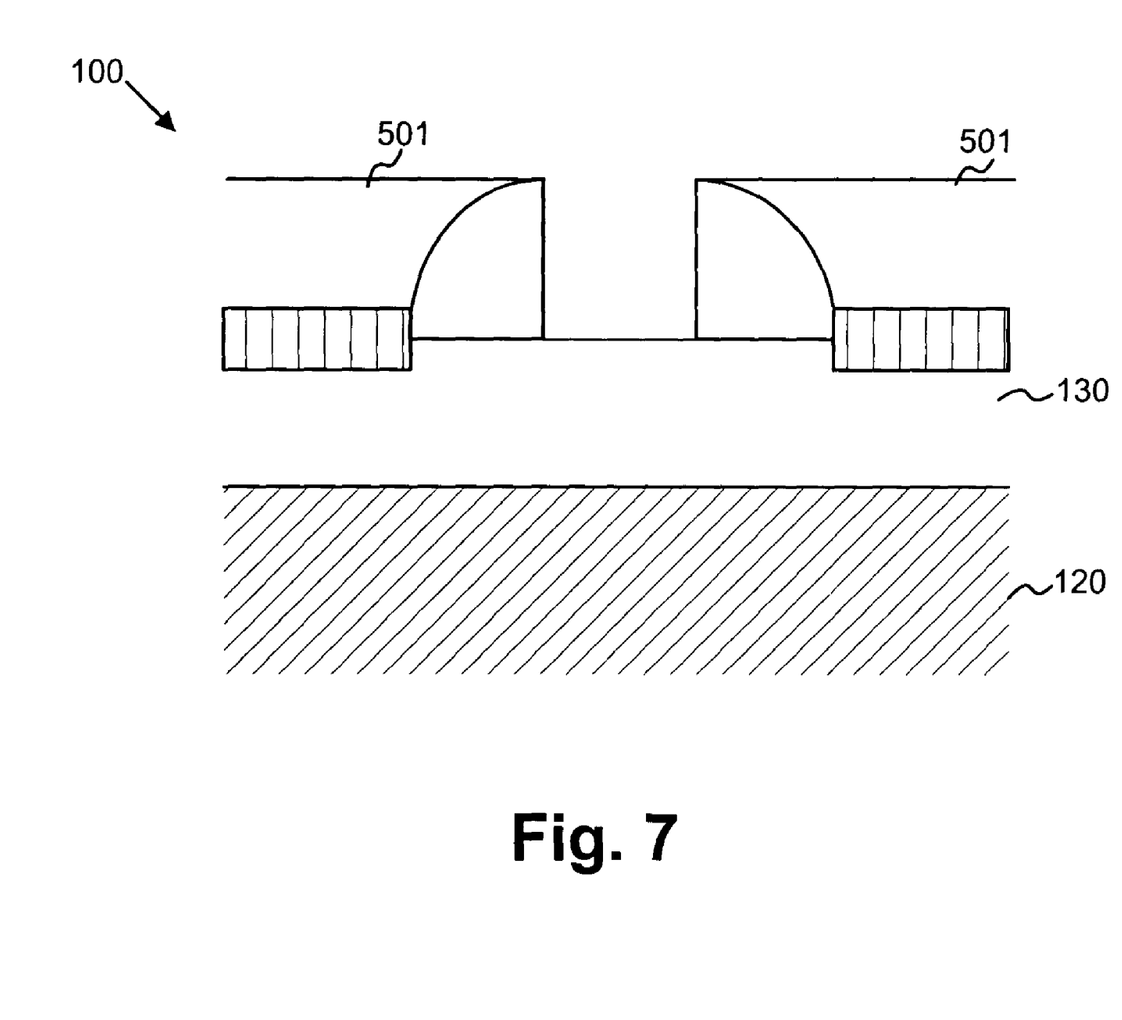
FIG. 7 is a cross-section illustrating the semiconductor device of FIG. 6 after removal of a dummy gate structure.

Surrounding layer 501 may next be used as a protective layer for the removal of dummy gate structure 220. In particular, semiconductor device 100 may be etched via an isotropic wet etch using a material that does not remove surrounding layer 501 or sidewall spacers 301, but removes the polysilicon of dummy gate structure 220. FIG. 7 is a cross-section illustrating semiconductor device 100 after removal of dummy gate structure 220.

Figure 8:
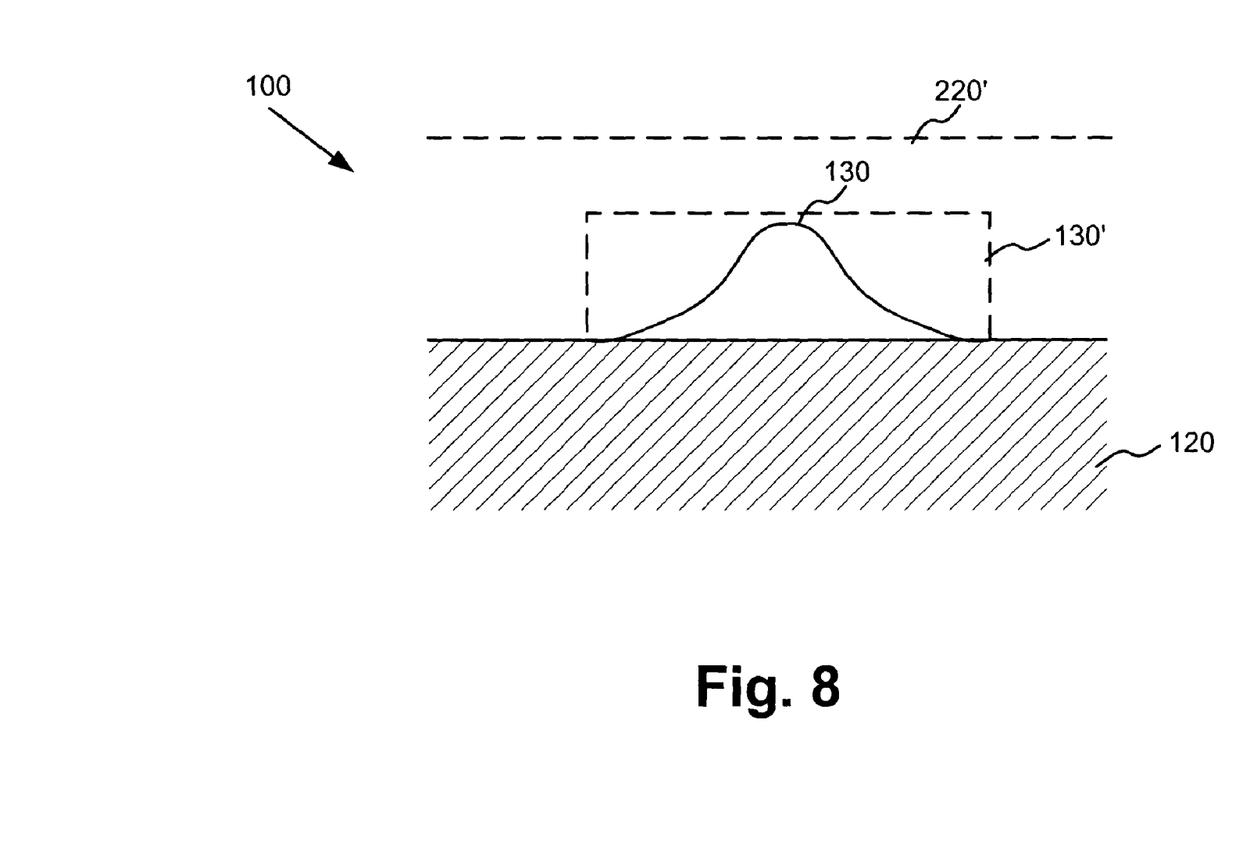
FIG. 8 is a cross-section taken along the line B–B' in FIG. 2A after removal of the dummy gate structure.

The isotropic wet etch described above, in addition to removing dummy gate structure 220, may also remove portions of silicon layer 130 that are below dummy gate structure 220. FIG. 8 is a cross-section taken along the line B–B' in FIG. 2A after removal of dummy gate structure 220. The presence of dummy gate structure 220 and silicon layer 130 prior to the isotropic wet etch are shown in FIG. 8 by dashed lines 220' and 130', respectively. Due to the wet etch, dummy gate structure 220 is removed and silicon layer 130 is reduced. In particular, as shown in FIG. 8, the width of silicon layer 130 in the channel region of semiconductor device is reduced. The portions of silicon layer 130 outside of the channel region are protected by spacers 301 or protective layer 501 and are thus not reduced. The reduced portion of silicon layer 130 forms the fin of semiconductor device 100.

Figure 9A:
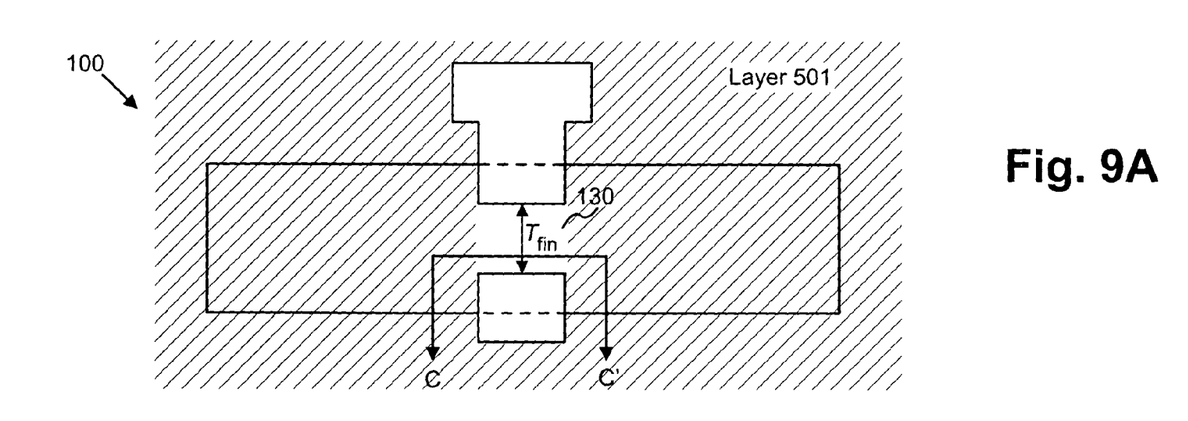
FIG. 9A schematically illustrates a top view of the semiconductor device after performing an additional etch.
Figure 9B:
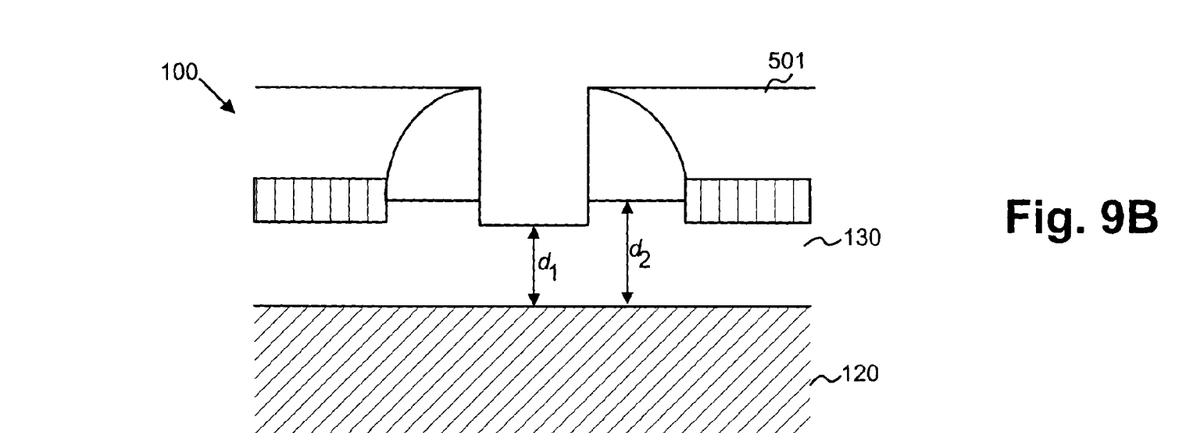
FIG. 9B is a cross-section taken along the line C–C' in FIG. 9A after removal of the dummy gate structure.

Consistent with an aspect of the invention, an additional etch of silicon fin 130 may next be performed. In one implementation, the exposed portion of silicon fin 130 may be etched to remove about 100 Å to about 300 Å of silicon fin 130. FIG. 9A schematically illustrates a top view of semiconductor device 100 after the additional etch of silicon fin 130. FIG. 9B is a corresponding cross-sections of FIG. 9A taken along the line C–C' in FIG. 9A. As shown, the width of the active area (i.e., the channel portion) of semiconductor device 100 is decreased from the whole width of silicon layer 130 to $T_{fin}$. In an exemplary implementation, $T_{fin}$ may range from about 50 Å to about 500 Å. Also, the height of the active area of semiconductor device 130 is reduced to height $d_1$ from the height $d_2$ of the source and drain regions of the semiconductor device. Height $d_1$ may be, for example, about 500 Å to about 700 Å and $d_2$ may be about 600 Å to about 1000 Å.

Figure 10A:
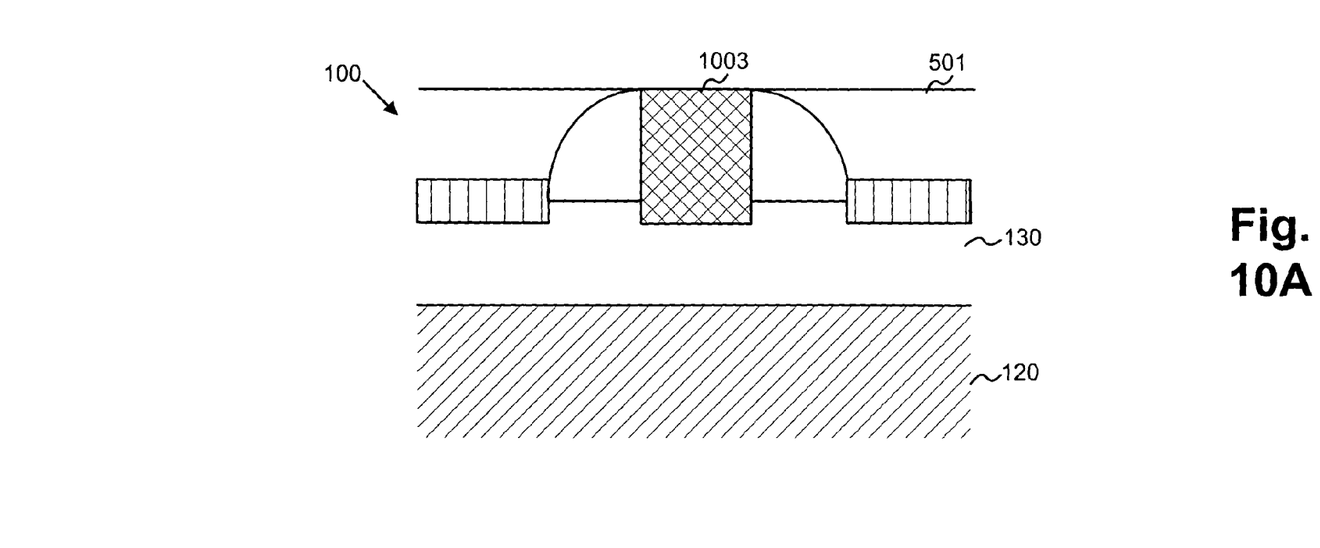
FIG. 10A is a cross-section illustrating a further stage in the formation of the semiconductor device of FIG. 9B.
Figure 10B:
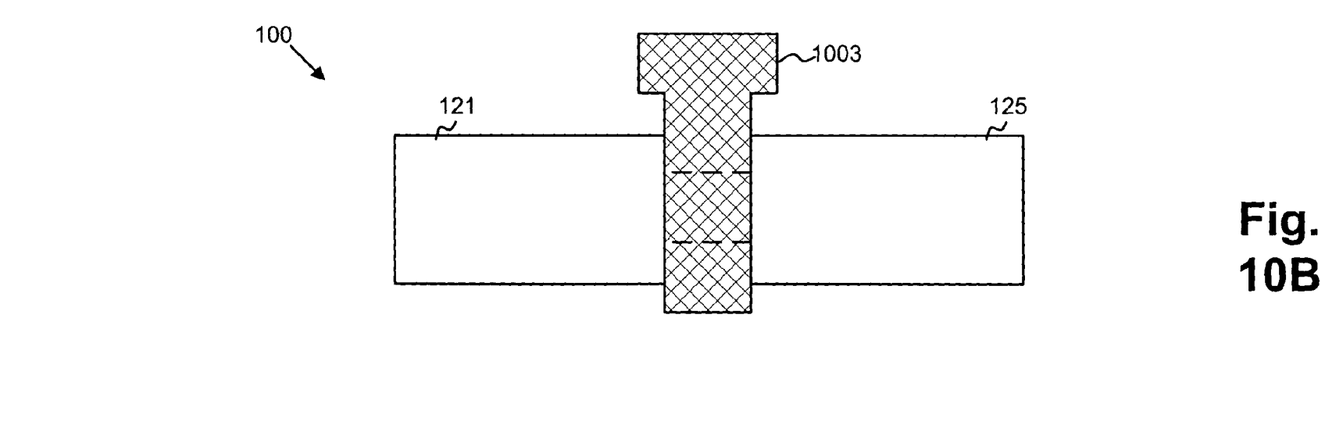
FIG. 10B schematically illustrates a top view of the semiconductor device shown in FIG. 10A.

FIG. 10A is a cross-section taken along line C—C' illustrating a further stage in the formation of semiconductor device 100. A metal layer 1003, such as, for example, tungsten, titanium, nickel, TaSiN, or TaN may be deposited on semiconductor device 100. Metal layer 1003 fills the recessed area corresponding to the removed dummy gate structure 220. Metal layer 1003 may then be planarized using a CMP process to the level of surrounding layer 501. The TEOS layer 501 may then be removed. The resulting semiconductor device 100, including the planarized metal layer 1003, is shown in FIG. 10A. A top-view of semiconductor device 100 is shown in FIG. 10B. As shown, metal layer 1003 has replaced dummy gate structure 220 as the gate for the semiconductor device 100. The raised and wider source/drain areas 121 and 125 reduce series resistance of semiconductor device 100, thereby improving transistor drive current.

OTHER IMPLEMENTATIONS

Multiple ones of the semiconductor devices illustrated above, along with other semiconductor devices, may be connected on a single chip using conductive lines. In one implementation, nanowires may be formed to implement some or all of these lines.

Figure 11A:
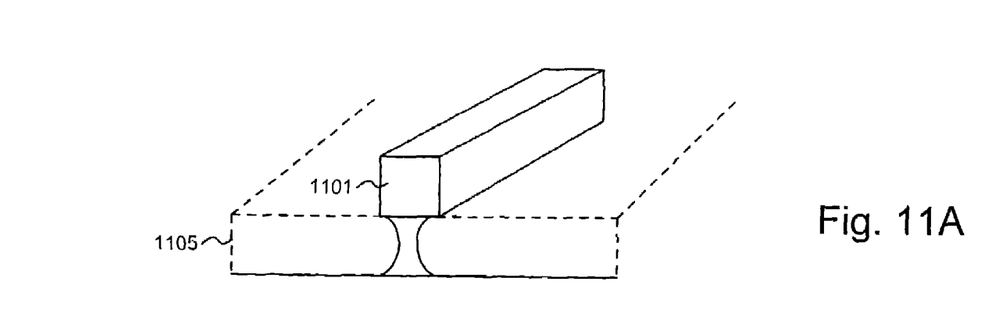
FIGS. 11A–11C are perspective diagrams illustrating formation of a nanowire.
Figure 11B:
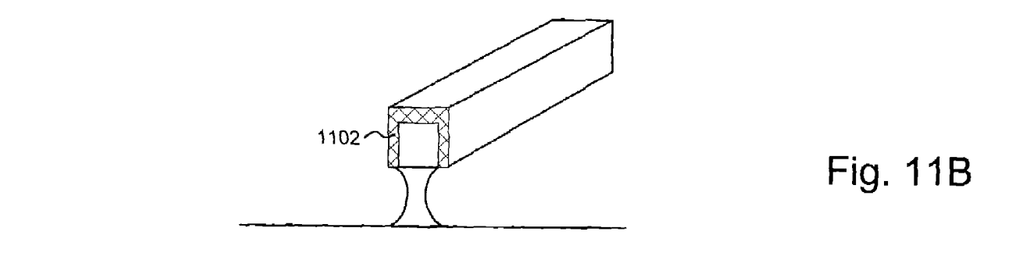
Figure 11C:
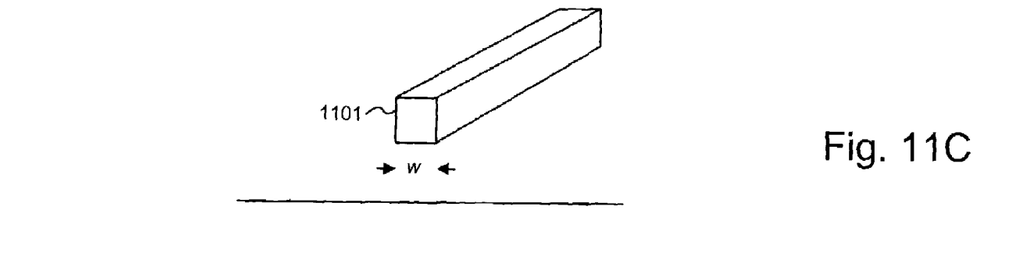

FIG. 11A is a perspective diagram illustrating formation of a nanowire. As shown, a semiconductive layer, such as Si, Ge, or SiGe is deposited and patterned to form a column 1101. Column 1101 may be formed above a base layer 1105, such as a buried oxide layer, that is etched to remove most of base layer 1105 except for a portion of the base layer 1105 under column 1101. As shown in FIG. 11B, a thin sacrificial oxide layer 1102 may then be formed around column 1101. The device may then be etched, as shown in FIG. 11C, to remove the base layer 1105. Accordingly, column 1101 is thus suspended based on its end connections and can function as a nanowire. The nanowire may be, for example, 1–10 nanometers in width (w).

CONCLUSION

The FinFET described above includes a metal gate and relatively wide source/drain regions that are raised above the channel area of the FinFET. The resultant FinFET has a reduced series resistance and thus has an improved transistor drive current.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor FinFET device comprising:
   an insulator;
   a semiconductor layer formed on the insulator, the semiconductor layer including a fin portion corresponding to a channel of the semiconductor device;
   a source region formed at a first end of the semiconductor layer, a height of the source region being higher than that of the fin;
   a drain region formed at a second end of the semiconductor layer, a height of the drain region being higher than that of the fin;
   a metal gate region formed to overlap at a top surface and at least one side surface of the fin; and
   oxide sidewalls formed adjacent to the metal gate region and above the top surface of the fin.

2. The device of claim 1, wherein the metal gate region overlaps the top surface and two side surfaces of the fin.

3. The device of claim 1, wherein the source and drain regions are silicided.

4. The device of claim 1, wherein a distance between the insulator and the metal gate region is about 500 Å to about 700 Å and a distance between the insulator and a top of the source or the drain region is about 600 Å to about 1000 Å.

5. The device of claim 1, wherein the metal gate comprises at least one of tungsten, titanium, nickel, TaSiN, and TaN.

6. The semiconductor device of claim 1, wherein the sidewall spacers have a width ranging from about 150 Å to about 1000 Å.

7. A FinFET device comprising:
   an insulator;
   a semiconductor layer formed on the insulator, the semiconductor layer including a fin portion corresponding to a channel of the semiconductor device;
   a source region formed from a first end of the semiconductor layer, a height of the source region being higher than that of the fin and a width of the source region being wider than that of the fin;
   a drain region formed from a second end of the semiconductor layer, a height of the drain region being higher than that of the fin and a width of the drain region being wider than that of the fin;
   a metal gate region formed to overlap at a top surface and at least one side surface of the fin; and
   sidewalls spacers formed adjacent at least portions of the metal gate region.

8. The FinFET device of claim 7, wherein the sidewall spacers have a width ranging from about 150 Å to about 1000 Å.

9. The FinFET of claim 8, wherein the source and drain regions are silicided.

10. The FinFET of claim 7, wherein a thickness of the fin portion ranges from about 500 Å to about 700 Å and a thickness of the source and drain regions ranges from about 600 Å to about 1000 Å.

* * * * *